(12) United States Patent
Iwaki

(10) Patent No.: US 10,952,358 B2
(45) Date of Patent: Mar. 16, 2021

(54) COMPONENT PICKUP METHOD

(71) Applicant: FUJI CORPORATION, Chiryu (JP)

(72) Inventor: Noriaki Iwaki, Hekinan (JP)

(73) Assignee: FUJI CORPORATION, Chiryu (JP)

( * ) Notice: Subject to any disclaimer, the term of this patent is extended or adjusted under 35 U.S.C. 154(b) by 280 days.

(21) Appl. No.: 16/078,876

(22) PCT Filed: Mar. 8, 2016

(86) PCT No.: PCT/JP2016/057186
§ 371 (c)(1),
(2) Date: Aug. 22, 2018

(87) PCT Pub. No.: WO2017/154109
PCT Pub. Date: Sep. 14, 2017

(65) Prior Publication Data
US 2019/0059181 A1    Feb. 21, 2019

(51) Int. Cl.
H05K 13/02 (2006.01)
H05K 13/04 (2006.01)
B65G 47/08 (2006.01)
H05K 13/00 (2006.01)

(52) U.S. Cl.
CPC ............. H05K 13/02 (2013.01); B65G 47/08 (2013.01); H05K 13/0069 (2013.01); H05K 13/043 (2013.01)

(58) Field of Classification Search
CPC .. H05K 13/0069; H05K 13/02; H05K 13/043; B65G 47/08
See application file for complete search history.

(56) References Cited

U.S. PATENT DOCUMENTS

| | | | | |
|---|---|---|---|---|
| 4,740,136 A * | 4/1988 | Asai | ..................... | H01L 21/6838 221/74 |
| 4,923,089 A * | 5/1990 | Hineno | ............... | H05K 13/0419 221/1 |
| 5,035,047 A * | 7/1991 | Harigane | .............. | H05K 13/021 29/740 |
| 5,784,777 A * | 7/1998 | Asai | .................... | H05K 13/0417 29/407.04 |
| 6,223,425 B1 * | 5/2001 | Asai | .................... | H05K 13/0434 29/740 |
| 6,507,997 B2 * | 1/2003 | Kawai | ................ | H05K 13/0812 29/833 |

FOREIGN PATENT DOCUMENTS

JP    11-20932 A    1/1999

OTHER PUBLICATIONS

International Search Report dated May 31, 2016 in PCT/JP2016/057186 filed Mar. 8, 2016.

* cited by examiner

*Primary Examiner* — Carl J Arbes
(74) *Attorney, Agent, or Firm* — Oblon, McClelland, Maier & Neustadt, L.L.P.

(57) ABSTRACT

A method for suitably picking up a component supplied in a lined up state. The component that is at pickup position is held using component holding device; and while holding the component with the component holding device, the component holding device is moved specified distance in a direction towards a component adjacent to the held component, then the component holding device is moved specified distance in a direction opposite to the first direction, and then the component holding device is raised.

6 Claims, 6 Drawing Sheets

(a)

(b)

(c)

(a)

(b)

(a)

(b)

(c)

COMPONENT PICKUP METHOD

TECHNICAL FIELD

The present application relates to a pickup method for picking up components such as electronic components supplied in a lined up state such that the components can be, for example, mounted on a board.

BACKGROUND ART

With technology as disclosed, for example, in the patent literature below, that is, technology for mounting components, which are arranged lined up inside a so-called stick, on a board, when picking up a single component, the component is picked up while contacting the next component to be picked up. Also, when picking up components for a so-called bulk-type component supply device, or when picking up component arranged in a grid on a tray without dividers between components, a component to be picked up is in a state contacting an adjacent component.

CITATION LIST

Patent Literature

Patent Literature 1
JP-A-H11-20932

BRIEF SUMMARY

Problem to be Solved

When a component is picked up in the above state, that is, in a state contacting an adjacent component, when the component to be picked up is raised, if an adjacent component is contacting that component, the adjacent component may be lifted up as well. If this occurs, when trying to pick up the component that was lifted up, it may not be possible to perform pickup appropriately, which may lead to a mounting error when trying to mount the picked up component on the board. The present disclosure takes account of such circumstances, and an object thereof is to provide a method for appropriately picking up a component supplied in a lined up state.

Means for Solving the Problem

To solve the above problem, the present disclosure is a component pickup method for holding and picking up a component supplied in a lined up state using a component holding device, the component pickup method including: (a) holding the component that is at a pickup position using the component holding device; and (b) while holding the component as is with the component holding device, moving the component holding device a specified distance in a first direction towards a component adjacent to the held component, then moving the component holding device in a direction opposite to the first direction, and then (c) raising the component holding device.

According to the component pickup method of the present disclosure, when picking up one component, because the component being picked up can be raised in a state with a gap maintained between that component and adjacent components, it is possible to prevent adjacent components from being raised up.

DESCRIPTION OF EMBODIMENTS

Hereinafter, a representative embodiment and alternative embodiment of the present disclosure are described with reference to the drawings. Note that, the claimable disclosure is not limited to embodiments or alternative embodiments described above, and various modifications and improvements may be performed based on knowledge of a person skilled in the art.

Embodiments

Figure 1:
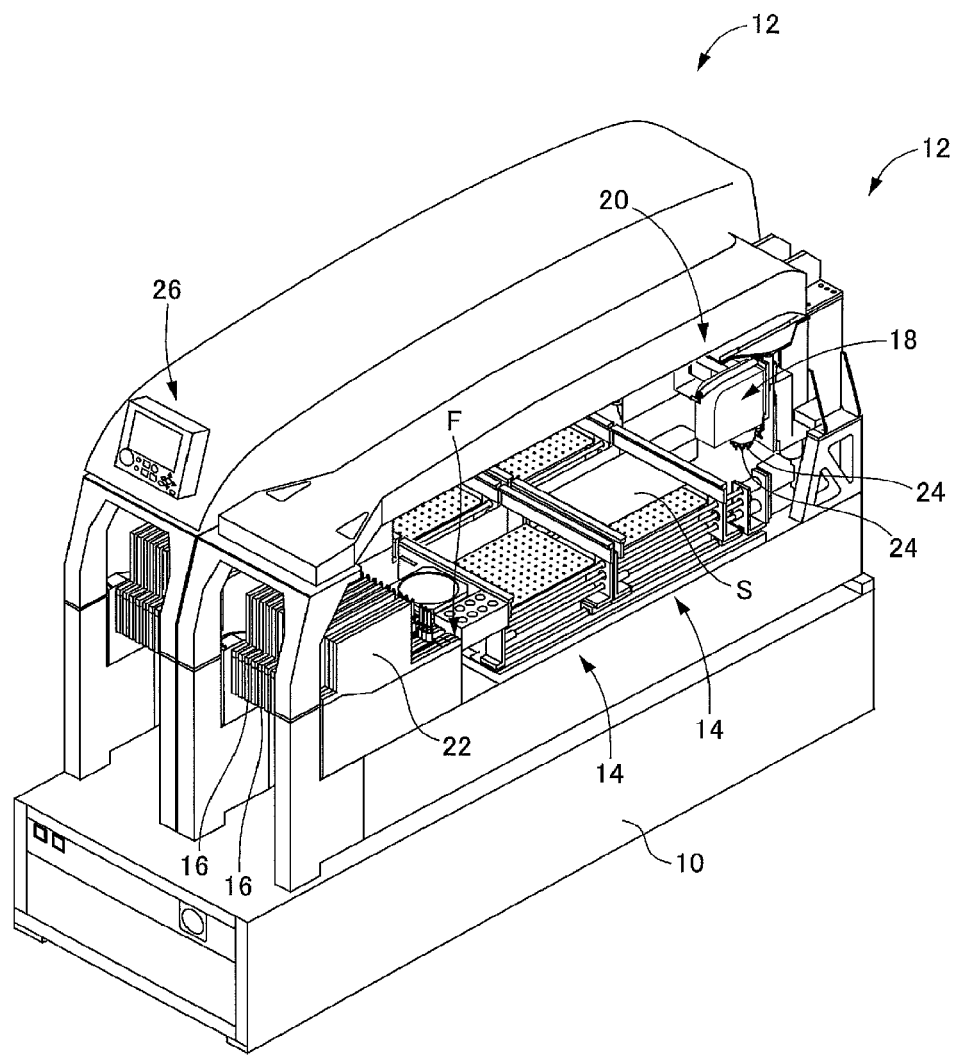
FIG. 1 is a perspective view showing a component mounter to which a component pickup method of the present disclosure is applied.

A component mounter to which a component pickup method of the present disclosure is applied includes, as shown in FIG. 1, base 10 and two mounting devices 12 arranged in a line on base 10, and is configured such that the two mounting devices consecutively mount components on a board S so as to complete mounting work with respect to the one board S. Note that, because the two mounting devices 12 have substantially the same configuration, descriptions are only given for the mounting device 12 on the front side. Also note, in the figure, mounting device 12 on the front side is shown in a state with the upper section cover removed.

Mounting device 12 includes (a) two conveyors 14 that convey board S and function as a board fixing device that fixes the board in position; (b) multiple component feeders 16 that are each a component supply device, (c) mounting head 18 that picks up a component supplied from a component feeder 16 and mounts the picked up component on an upper surface of the board S fixed by conveyor 14, and (d) head moving device 20 that moves mounting head 18 between conveyor 14 and component feeder 16.

The two conveyors 14, for example, by conveying and fixing boards S alternately, allow mounting work to be performed on boards S alternately in mounting device 12. That is, the component mounter is a component mounter with two lanes. As described later, component feeder 16 is a feeder configured to house components in case 22 in a bulk state (a loose state) and consecutively convey the components to specified pickup position F, and is otherwise known as a bulk feeder.

Mounting head 18 includes on a lower section thereof suction nozzle 24 as a component holding device. Mounting head 18 is an indexing-type head that intermittently rotates multiple suction nozzles 24 so as to pick up multiple components and mount the multiple picked up components on board S. Also, mounting head 18 including a raising and lowering mechanism for raising and lowering each suction nozzle 24 during component pickup and mounting. That is, each suction nozzle 24 is capable of being moved up and down by the raising and lowering mechanism. A suction nozzle 24 picks up and holds a component via the upper surface of the component by being supplied with negative pressure, and releases the pickup and holding of the component by the supply of negative pressure being stopped.

Head moving device 20 is a so-called XY-type robot device configured to move mounting head 18 along a plane parallel to the upper surface of board S. Conveyors 14, component feeders 16, mounting head 18, and head moving device 20 are controlled by controller 26 based around a computer.

Figure 2:
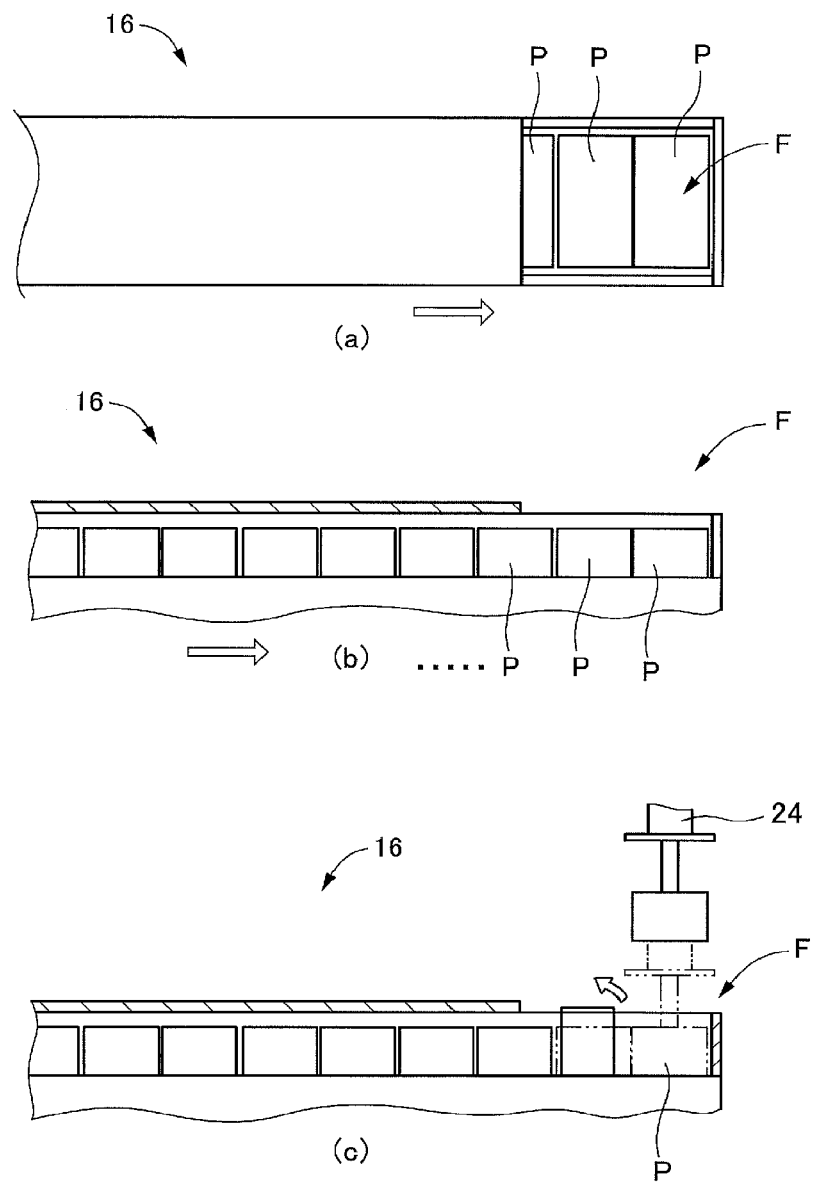
FIG. 2 illustrates a component feeder provided on the component mounter and a problem point when picking up a component supplied from the component feeder.

With component feeders 16, as shown from above in FIG. 2(a) and from the side as a cross section view in FIG. 2(b), components P are supplied lined up in a single row. To describe in detail, components P are consecutively conveyed in a lined up state in a direction in which the components are lined up (the direction of the arrows in the figures), and are supplied such that the component at the end of the line, that is, the leading component, is positioned at pickup position F. Because components P are conveyed by being pushed by a subsequent component P, the components may contact each other. As shown in FIG. 2(c), if the leading component P that is positioned at pickup position F is picked up while positioned in this state, if the component P is simply picked up and raised by suction nozzle 24, the component P to be picked up next that is adjacent to the picked up component P may be raised up unintentionally due to the friction between the components P.

Figure 3:
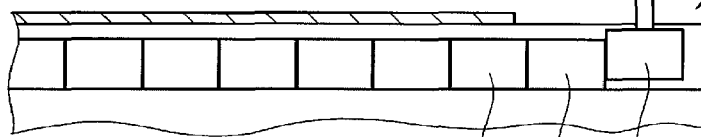
FIG. 3 illustrates a procedure of a component pickup method of the present disclosure when picking up a component from the component feeder.
Figure 3:
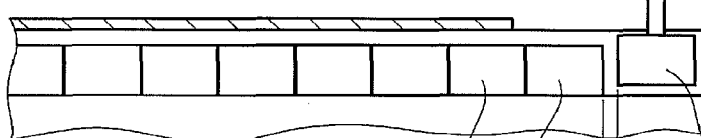
Figure 3:
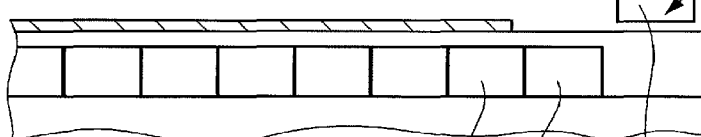

Here, with the present component mounter, as shown in FIG. 3(a), when picking up component P positioned at pickup position F, first, as shown in FIG. 3(a), the component P is held by suction nozzle 24, then, in that held state, suction nozzle 24 is moved by specified distance L1 in the direction of the adjacent component P, that is, in the direction of the next component P to be picked up. By this, the next component P is moved in the opposite direction to the conveyance direction by the held component P. Next, as shown in FIG. 3(b), suction nozzle 24 is moved specified distance L2 in a direction opposite to the first movement direction. Specified distance L2 is smaller than specified distance L1. Specifically, for example, specified distance L2 may be approximately half of specified distance L1. Accordingly, by performing the above operations, it is possible to create gap D of a certain size between the held component P and the component P to be held next. In this state, as shown in FIG. 3(c), if suction nozzle 24 is raised, thanks to gap D, the next component to be picked up is prevented from being raised.

Note that, just because suction nozzle 24 is moved by specified distance L1 in the direction of the next component P does not mean that the next component P will be moved by exactly specified distance L1. For example, in a case in which components P are already flush against each other and the like, the movement will be limited. In such a case, that is, in a case in which the next component P does not move by specified distance L1, for example, it is possible to suitably achieve the above gap D by using an elastically deformable suction nozzle 24 or the like, and moving the suction nozzle 24 by specified distance L1 with the component P held as is, and then moving suction nozzle 24 by specified distance L2 in the opposite direction.

With the above pickup method, the targets are components being picked up from a bulk feeder, but the targets may be components picked up from another type of component feeder. For example, the targets may be components being picked up from a so-called stick feeder. A stick feeder is configured to convey components arranged in a single line in a conveyance direction using a rod, and components can be picked up from a stick feeder using a similar method to that for a bulk feeder.

Alternative Embodiment

Figure 4:
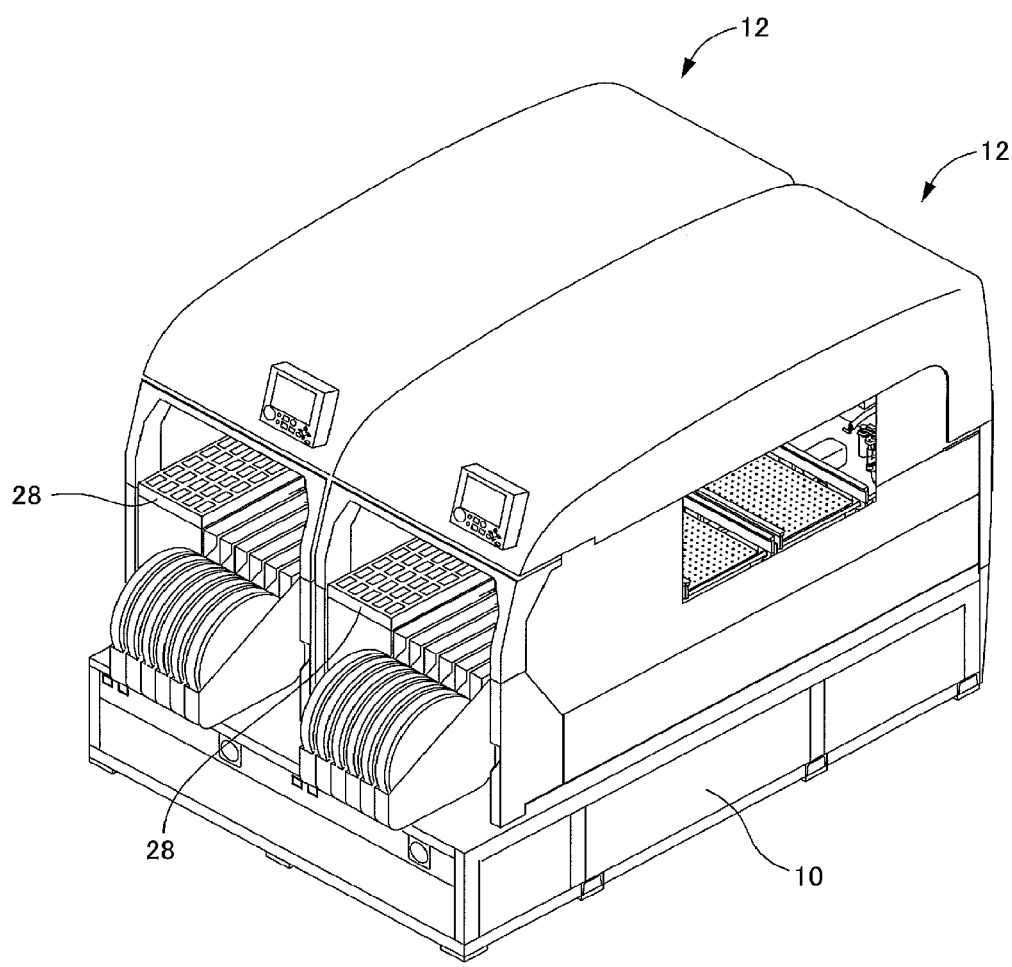
FIG. 4 is a perspective view showing a component mounter to which a component pickup method of the present disclosure is applied.

As an alternative component pickup method, a pickup method for components housed in a component tray will be described. For example, as shown in FIG. 4, component tray 28 is provided together with tape feeders. Note that, the component mounters 12 shown in FIG. 4 are wider than the component mounters shown in FIG. 1.

Figure 5:
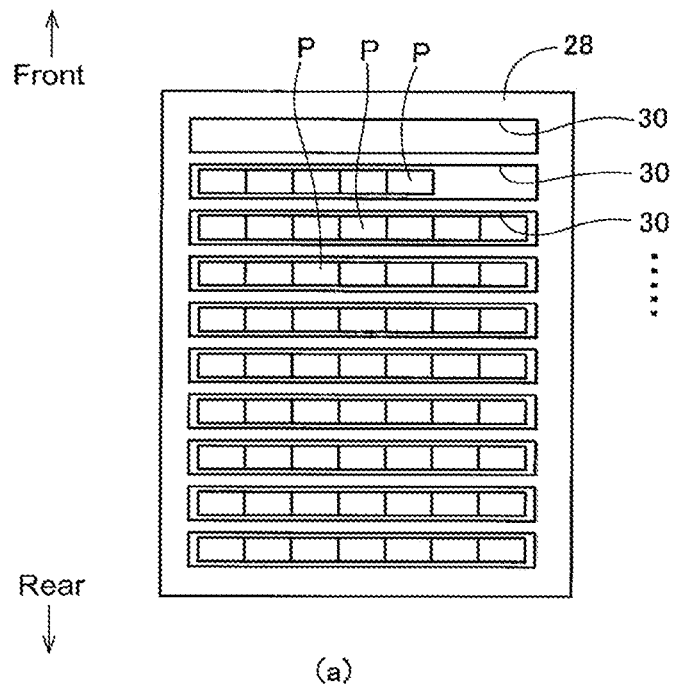
FIG. 5 illustrates components in a state arranged on a component tray and a procedure of a component pickup method of the present disclosure for picking up those components.
Figure 5:
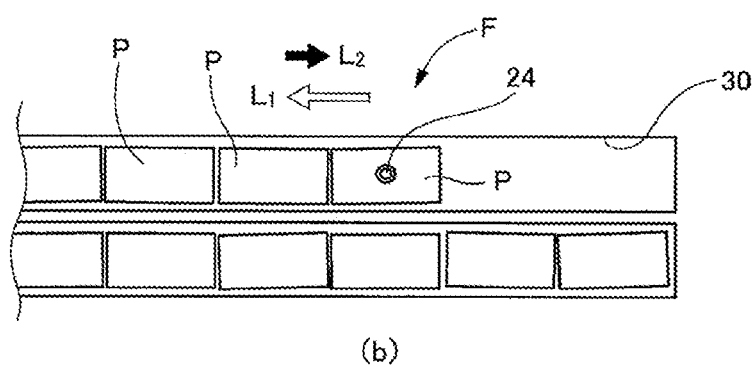

There are various types of components tray 28, with one example being shown in FIG. 5(a). Multiple long grooves 30 are formed in the component tray 28 shown in FIG. 5(a), and components P are arranged in a single line in each groove 30. Components P supplied by such a component tray 28 are, for example, consecutively picked up from the front side groove 30 to the rear side groove 30, with components P being picked up consecutively at each groove 30 from the right side. That is, when picking up components P from grooves 30, the component P furthest to the right of the components P remaining in the groove 30 is the component P positioned at pickup position F. In this case, the component P adjacent to that component on the left side is the component P to be picked up next and, as shown in FIG. 5(b), the component P positioned at pickup position F is picked up and held by suction nozzle 24, then moved specified distance L1 to the left (shown by the white arrow), then moved specified distance L2 to the right (black arrow). By performing such pickup operation, a suitable gap is created with the component P to be picked up next.

Suction nozzle 24 may then be raised. By performing such pickup operations, the adjacent component P, that is, the component P to be picked up next, is prevented from being raised.

Further, there are cases in which components P are supplied from a component tray 32 as shown in FIG. 6(a). With the component tray 32 shown in FIG. 6(a) components P are arranged in a grid, that is, multiple components P are arranged adjacent to each other in front-rear and left-right directions thereby forming rows and columns. Pickup of components P from such a component tray 32 is performed consecutively from a front side row (upper side in the figure) to a back side row (lower side in the figure), with components P being picked up consecutively at each row from the right side to the left side.

When consecutively picking up components P from such a component tray 32, the component P furthest to the right in the row nearest the front of the remaining components P is the component P positioned at pickup position F.

When picking up that component P, as shown in FIG. 6(b), first, the component P positioned at pickup position F is picked up and held by suction nozzle 24, and in that state, suction nozzle 24 is moved by specified distance L1 in the direction (white arrow) of the adjacent component P in the same row, then suction nozzle 24 is moved by specified distance L2 in the opposite direction (black arrow). Then, further, suction nozzle 24 is moved by specified distance L1' in the direction of the adjacent component P in the row to the rear side, then, suction nozzle 24 is moved by specified distance L2' in the direction opposite to that direction. Put simply, suction nozzle 24 is moved right after being moved left, and is then moved forward after being moved backward. According to such operations, it is possible to create a gap both between the component P positioned at pickup position F and the component P to the left, and between the component P positioned at pickup position F and the component P to the rear.

Figure 6:
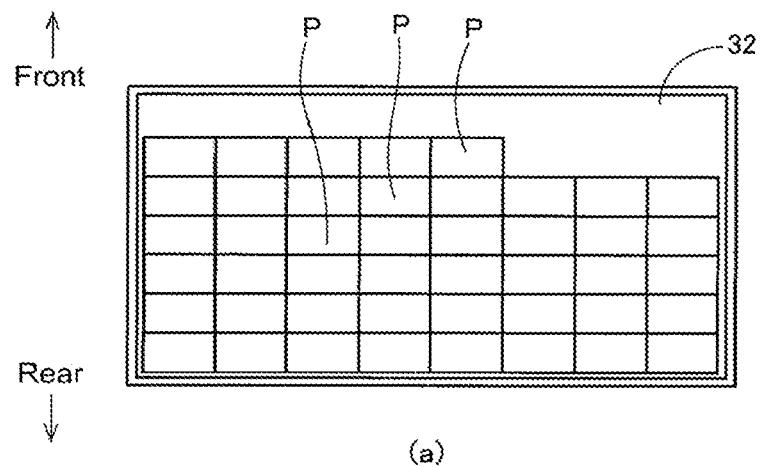
FIG. 6 illustrates components in a state arranged on a different component tray and a procedure of a component pickup method of the present disclosure for picking up those components.
Figure 6:
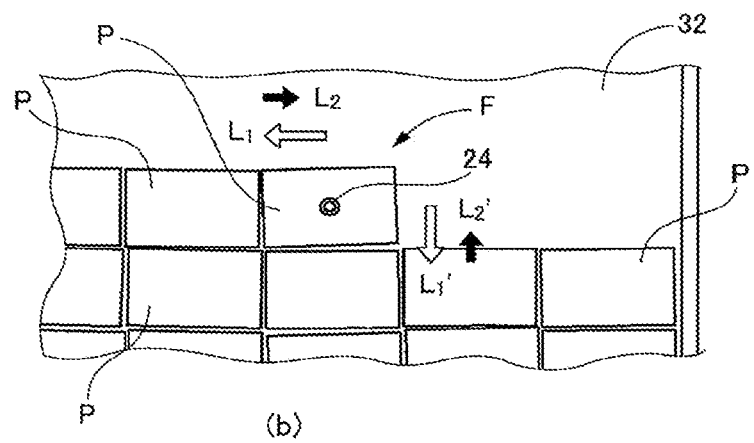
Figure 6:
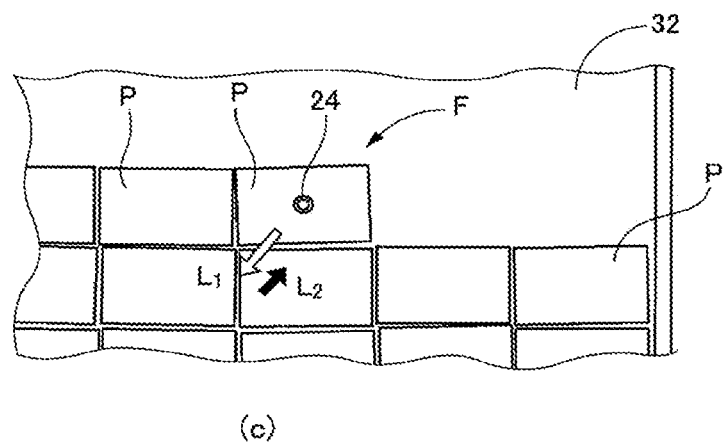

Note that, as shown in FIG. 6(*c*), it is possible to create a gap both between the component P positioned at pickup position F and the component P to the left, and between the component P positioned at pickup position F and the component P to the rear by moving suction nozzle 24 by specified distance L1' in a direction (white arrow) diagonally to the left and rear that includes both a left portion and a backward portion, and then move suction nozzle 24 in a direction (black arrow) by specified distance L2' in a diagonal direction opposite to that direction. Also, in a case in which it is not necessary to create a gap with the component P positioned at pickup position F on both the left side and the rear side, that is, when creating a gap at only one of the left side or the rear side, it is possible to perform only one of the above-mentioned left-right operation or front-rear operation.

With a component pickup method of the above embodiments, a suction nozzle that picks up and holds a component by being supplied with negative pressure is used as a component holding device, but the component holding device is not restricted to a suction nozzle, for example, an item such as a clamper that grips a component may be used.

REFERENCE SIGNS LIST

12: mounting device; 16: component feeder (component supply device); 18: mounting head; 20: head moving device; 24: suction nozzle (component holding device); 26: controller 28: component tray 30: groove; 32: component tray; F: pickup position; P: component L1, L2, L1', L2': specified distance; D: gap

The invention claimed is:

1. A component pickup method for holding and picking up a component supplied in a feeder lined up in a single line using a component holding device, the component pickup method comprising:
    lowering the component holding device in a vertical direction to contact the component;
    holding the component that is at a pickup position along the single line using the component holding device; and
    while holding the component with the component holding device, moving the component holding device a first specified distance in a first direction along the single line towards a component adjacent to the held component, then moving the component holding device a second specified distance in a second direction opposite to the first direction, and then raising the component from the feeder with the component holding device.

2. The component pickup method according to claim 1, wherein
    a first component positioned at one end of a line of the components supplied lined up in the single line is the component at the pickup position to be picked up, and
    while the component holding device is holding the component at the pickup position, the component holding device is moved the first specified distance in the first direction towards a second component to be picked up next, and then the component holding device is moved in the second direction away from the second component to be picked up next.

3. The component pickup method according to claim 2, wherein
    a first component positioned at the leading end of an end of a line of components among components supplied so as to be fed consecutively lined up in the single line is considered to be the component at the pickup position.

4. The component pickup method according to claim 1, wherein
    components arranged in a grid of rows and columns are to be consecutively picked up, the single line being one of the rows and columns, and
    with the component holding device holding the component at the component pickup position, the component holding device is moved the first specified distance in the first direction towards a component adjacent to and in a same row or an adjacent row as the held component and then the component holding device is moved in the second direction opposite to the first direction.

5. The component pickup method according to claim 1, wherein
    the second specified distance in the second direction is smaller than the first specified distance.

6. The component pickup method according to claim 1, wherein the component holding device is a suction nozzle configured to pick up the component via a supply of negative pressure.

* * * * *